US011187528B2

(12) United States Patent
Reinmuth et al.

(10) Patent No.: US 11,187,528 B2
(45) Date of Patent: Nov. 30, 2021

(54) ROTATION RATE SENSOR, METHOD FOR MANUFACTURING A ROTATION RATE SENSOR

(71) Applicant: Robert Bosch GmbH, Stuttgart (DE)

(72) Inventors: Jochen Reinmuth, Reutlingen (DE); Robert Maul, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 433 days.

(21) Appl. No.: 16/058,228

(22) Filed: Aug. 8, 2018

(65) Prior Publication Data

US 2019/0049248 A1    Feb. 14, 2019

(30) Foreign Application Priority Data

Aug. 8, 2017   (DE) .................. 102017213802.5

(51) Int. Cl.
| | |
|---|---|
| *G01C 19/5747* | (2012.01) |
| *G01C 19/5762* | (2012.01) |
| *G01C 19/5712* | (2012.01) |
| *B81B 3/00* | (2006.01) |
| *G01C 19/5769* | (2012.01) |
| *G01C 19/5783* | (2012.01) |

(52) U.S. Cl.
CPC ........ *G01C 19/5712* (2013.01); *B81B 3/0051* (2013.01); *B81B 3/0072* (2013.01); *G01C 19/5747* (2013.01); *G01C 19/5762* (2013.01); *G01C 19/5769* (2013.01); *G01C 19/5783* (2013.01); *B81B 2203/058* (2013.01)

(58) Field of Classification Search
CPC ............... G01C 19/56; G01C 19/5705; G01C 19/5712; G01C 19/5719; G01C 19/5747; G01C 19/5762
See application file for complete search history.

(56) References Cited

U.S. PATENT DOCUMENTS

| | | | |
|---|---|---|---|
| 2005/0217378 A1* | 10/2005 | Ishikawa ................. | G01P 1/023 73/514.01 |
| 2006/0283245 A1 | 12/2006 | Konno et al. | |
| 2011/0232384 A1* | 9/2011 | Akashi ................. | G01C 19/574 73/504.12 |
| 2013/0247669 A1 | 9/2013 | Swanson et al. | |
| 2015/0176995 A1 | 6/2015 | Kim et al. | |

* cited by examiner

*Primary Examiner* — Herbert K Roberts
(74) *Attorney, Agent, or Firm* — Norton Rose Fulbright US LLP; Gerard Messina

(57) ABSTRACT

A rotation rate sensor including a substrate, a drive structure, which is movable with regard to the substrate, a detection structure, and a Coriolis structure, the drive structure, the Coriolis structure, and the detection structure being essentially situated in a layer, in that an additional layer is situated essentially in parallel to the layer above or underneath the layer, a mechanical connection between the Coriolis structure and the drive structure being established with a first spring component, the first spring component being configured as a part of the additional layer, and/or a mechanical connection between the detection structure and the substrate being established with a second spring component, the second spring component being configured as a part of the additional layer.

15 Claims, 5 Drawing Sheets

ROTATION RATE SENSOR, METHOD FOR MANUFACTURING A ROTATION RATE SENSOR

FIELD OF THE INVENTION

The present invention is directed to a rotation rate sensor.

BACKGROUND INFORMATION

Rotation rate sensors on substrates are believed to be understood in general. These involve special microelectromechanical systems (MEMS) on a silicon basis with the aid of which rotation rates may be measured. Sensors of this type are used in various applications. Typically, rotation rate sensors include a drive frame, a detection frame, and a Coriolis frame. The detection frame is connected to the substrate via springs and to the Coriolis frame via further springs. The Coriolis frame includes additional springs which connect same to the drive frame. The drive frame is connected to the substrate via springs and may be driven via electrodes, for example comb electrodes. Coriolis frames, drive frames, and detection frames are typically configured within a comparably thick polysilicon functional layer which is situated above a thin, buried polysilicon layer. Typically, the different springs which connect the frames among one another and to the substrate are configured as a part of the thick polysilicon functional layer. The buried layer is used as a strip conductor or as an electrode. Oxide layers, in which contact areas may be provided to electrically contact the different frames, are deposited between the substrate and the buried polysilicon layer and between same and the thick polysilicon layer. Such thick polysilicon functional layers or the frames and springs are typically exposed through a trenching process and an oxide sacrificial layer process. The thus manufactured structures are then often hermetically enclosed with the aid of a suitable bonding process using a cap wafer.

Due to the fact that it is possible to build the structures in such sensors in a very narrow manner, it is possible to build springs which make a movement in parallel to the substrate possible. This type of springs may be built in such a way that they are very soft in a direction in parallel to the substrate and are additionally very stiff in the other two directions. Rotation rate sensors of this type are therefore well suited to detect rotation rates which are applied perpendicularly to the surface or the main extension direction of the substrate.

It is disadvantageous, however, that rotation rates which are applied in the at least one main extension direction of the substrate or of the thick polysilicon functional layer are measurable only to an insufficient extent with the aid of sensors of this type or of understood modifications of such sensors.

SUMMARY OF THE INVENTION

It is an object of the present invention to provide an advantageous rotation rate sensor including a substrate with the aid of which rotation rates are measurable which are applied within a main extension plane of the substrate.

The rotation rate sensor according to the present invention as described herein has the advantage over the related art that a mechanical connection between the Coriolis structure and the drive structure is established with the aid of a first spring component, the first spring component being configured as a part of the additional layer, and/or that a mechanical connection between the detection structure and the substrate is established with the aid of a second spring component, the second spring component being configured as a part of the additional layer. In this way, it is possible according to the present invention to achieve a particularly advantageous suspension. By using a first spring component or a second spring component, it is possible to implement a suspension which is comparably soft in an extension direction perpendicular to the substrate and comparably stiff in all directions (in particular a first and a second main extension direction) in a main extension plane of the substrate or of the layer in which the detection structure, Coriolis structure, and drive structure are essentially configured. This results in particularly advantageous possibilities of detecting rotation rates which are applied in a main extension direction of the sensor or the layer or the substrate. According to the present invention, it is thus possible for a cost-effectively manufacturable rotation rate sensor to be implementable which is capable of detecting with high precision rotation rates, which are applied in a main extension direction of the sensor or the layer or the substrate. Furthermore, it is possible according to the present invention to configure the rotation rate sensor in a particularly space-saving manner as compared to the sensors from the related art.

As compared to the use of torsion springs, which may be supported softly with regard to a movement toward the substrate or away from the substrate in order to facilitate a movement perpendicular to the substrate (and thus a detection of rotation rates which are applied in a main extension direction of the sensor or of the layer or of the substrate), it is particularly advantageously possible according to the present invention that the first and/or the second spring component(s) (or the first and/or the second spring components) are comparably stiff in all directions (in particular a first and a second main extension direction) in a main extension plane of the substrate or the layer. In this way, a particularly advantageous behavior of the rotation rate sensor may be achieved according to the present invention.

Advantageous specific embodiments and refinements of the present invention may be derived from the further descriptions herein as well as the description with reference to the drawings.

Due to the fact that according to one specific embodiment of the present invention, the first spring component has a lesser expansion in an extension direction perpendicular to a main extension plane of the additional layer than a first main extension direction of the additional layer and in a second main extension direction of the additional layer and/or the second spring component has a lesser expansion in the extension direction perpendicular to the main extension plane of the additional layer than in the first main extension direction of the additional layer and in the second main extension direction of the additional layer, it is possible that the first and/or the second spring component(s) is/are thin and comparably soft in the extension direction perpendicular to the main extension plane of the additional layer. It is possible at the same time that the expansion of the first and/or the second spring component(s) in the first and the second main extension direction(s) of the additional layer is greater than the thickness (in the extension direction perpendicular to the additional layer) of the first and/or the second spring component(s). It is thus particularly advantageously possible that the first and/or the second spring component(s) has/have a higher stiffness in all directions in the main extension plane of the additional layer than in the extension direction perpendicular to the main extension plane of the additional layer, thus allowing for a particularly advantageous rotation rate sensor for detecting rotation rates, which are applied within the main extension direction of the layer/substrate, to be implemented.

Due to the fact that according to one specific embodiment of the present invention the additional layer is formed underneath the layer, a further additional layer being essentially formed in parallel to the layer above the layer, a mechanical connection between the Coriolis structure and the drive structure being established with the aid of a further first spring component, the further first spring component being configured as a part of the further additional layer, and/or a mechanical connection being established between the detection structure and the substrate with the aid of a further second spring component, the further second spring component being configured as apart of the further additional layer, it is possible that above as well as underneath the layer, resilient mechanical connections are established between the Coriolis structure and the drive structure and/or between the detection structure and the substrate. This makes it particularly advantageously possible to prevent or reduce a tilting of the individual structures, in particular in the case of a movement of the detection structure in the extension direction perpendicular to the main extension plane of the substrate/layer. In this way, a particularly advantageous behavior may be achieved during operation of the rotation rate sensor.

Due to the fact that according to one specific embodiment of the present invention, the first spring component and/or the second spring component include(s) a framework structure or a lattice structure, in particular the further first spring component and/or the further second spring component including a framework structure or a lattice structure, it is advantageously possible to achieve a particularly advantageous stiffness of the first and/or the second spring component(s) (and in particular the further first and/or the further second spring component(s)) in all directions of the main extension plane of the layer/substrate.

Due to the fact that according to one specific embodiment of the present invention, the first spring component has a lesser expansion in an extension direction perpendicular to a main extension plane of the additional layer than the Coriolis structure, detection structure and/or drive structure and/or the second spring component has a lesser expansion in an extension direction perpendicular to a main extension plane of the additional layer than the Coriolis structure, detection structure and/or drive structure, in particular the further first spring component has a lesser expansion in a further extension direction perpendicular to a further main extension plane of the further additional layer than the Coriolis structure, detection structure and/or drive structure and/or in particular the further second spring component having has a lesser expansion in the further extension direction perpendicular to the further main extension plane of the further additional layer than the Coriolis structure, detection structure and/or drive structure, it is possible that the spring components in the extension direction perpendicular to the main extension plane of the layer/substrate are less stiff than the structures which are formed (at least for the most part) within or as a part of the layer, whereby a particularly advantageous behavior of the sensor may be achieved.

Due to the fact that according to one specific embodiment of the present invention, a detection electrode is situated at least partially above or underneath the detection structure, it is particularly advantageously possible to detect a movement of the detection structure in an extension direction perpendicular to the main extension plane of the substrate/layer and thus to measure rotation rates which are applied in a direction within the main extension plane of the substrate/layer. In this regard, it is advantageously possible that the detection electrode and the detection structure are configured as a plate capacitor.

It may be provided according to the present invention that the rotation rate sensor includes multiple first and/or second spring components (and potentially multiple further first and/or second spring components) which are in particular situated at different sides of the rotation rate sensor, which may be at uniform angular distances and/or having a symmetry.

According to the present invention, it is possible in principle that the Coriolis structure, the drive structure, and the detection structure are each configured as closed or not closed frames or also as multiple frame parts.

According to one specific embodiment of the present invention, it is possible that the first spring component and/or the second spring component has/have a lesser spring constant for a force applied in an extension direction perpendicular to a main extension plane of the additional layer than for a force applied in a first main extension direction of the additional layer and/or in a second main extension direction of the additional layer, in particular the further first spring component and/or the further second spring component having a lesser spring constant for a force applied in a further extension direction perpendicular to a further main extension plane of the further additional layer than for a force applied in a first further main extension direction of the further additional layer and/or in a second further main extension direction of the further additional layer.

The method according to the present invention for manufacturing a rotation rate sensor according to one specific embodiment of the present invention has the advantages over the related art already described in the context of the rotation rate sensor according to the present invention or one specific embodiment of the rotation rate sensor according to the present invention.

Exemplary embodiments of the present invention are illustrated in the drawings and elucidated in greater detail in the following description.

In the different figures, identical parts are always provided with identical reference numerals and are thus generally named or mentioned only once.

DETAILED DESCRIPTION

Figure 1:
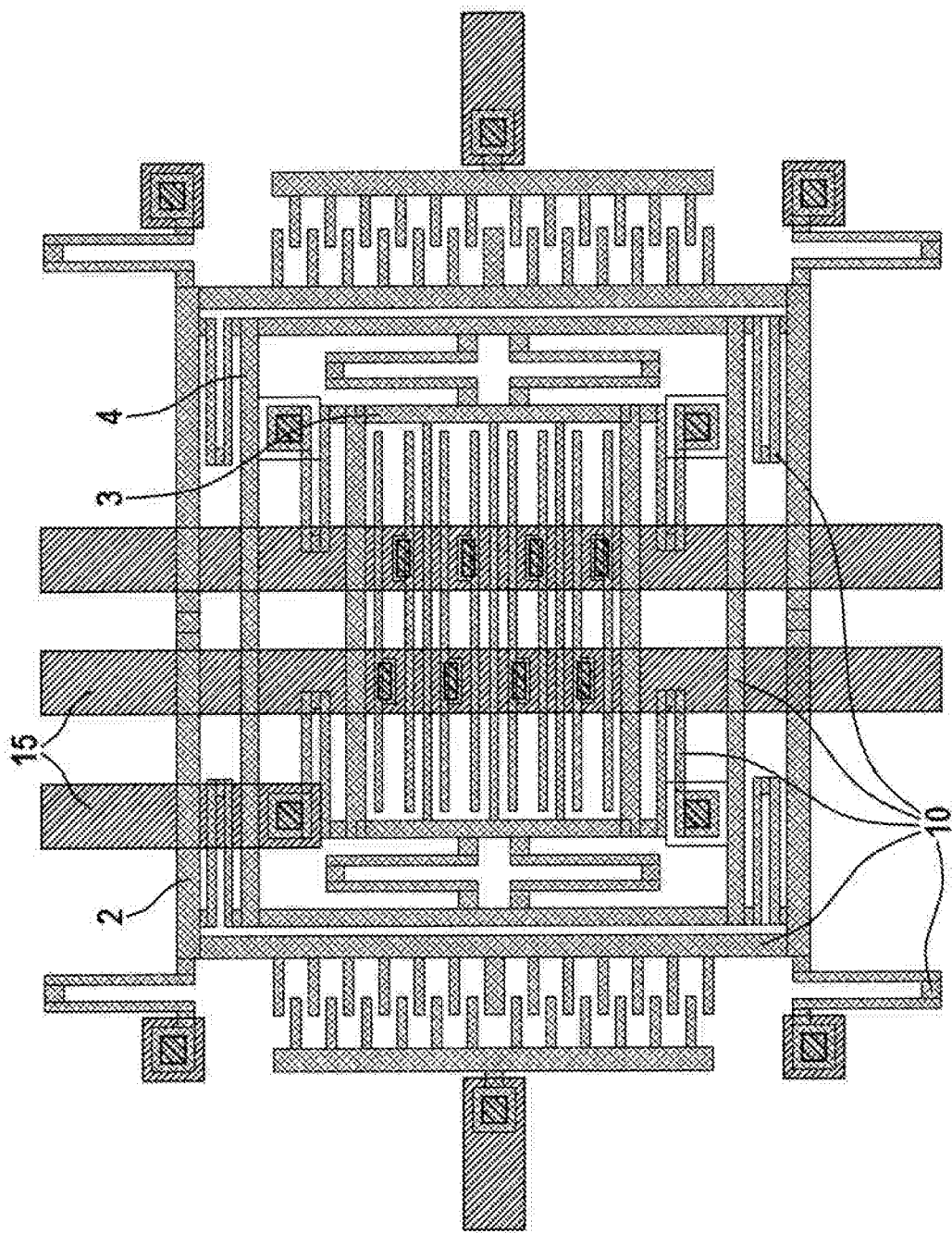
FIG. 1 schematically shows a top view of a rotation rate sensor according to the related art.

In FIG. 1, a top view of a rotation rate sensor according to the related art is schematically illustrated. The rotation rate sensor includes a Coriolis structure 4, a drive structure 2, and a detection structure 3. Structures 2, 3, and 4 are formed in a layer 10. Coriolis structure 4 and drive structure 2 are connected via springs. The detection structure and the substrate are also connected via springs. The above-mentioned springs are configured in layer 10 just as structures 2, 3, and 4. Rotation rate sensors of this type may be used to detect rotation rates, in particular, which are applied perpendicularly to the surface of the substrate.

Figure 2:
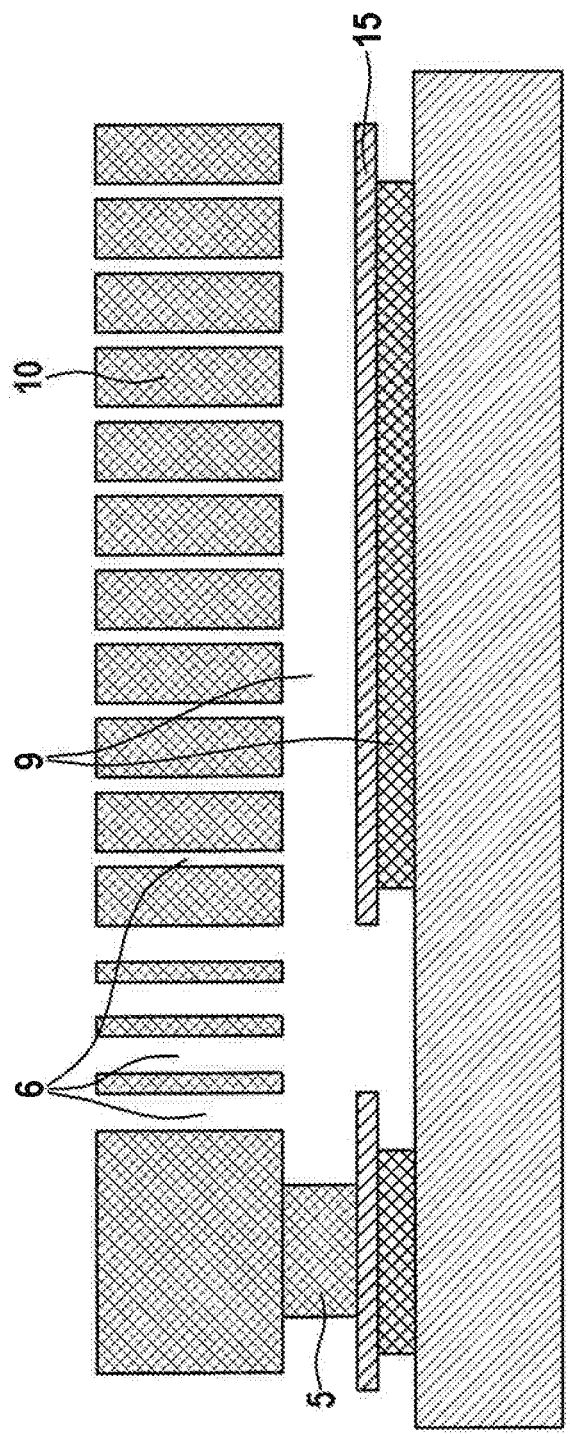
FIG. 2 schematically shows a cross section through a section of a rotation rate sensor according to the related art.

In FIG. 2, a cross section through a section of a rotation rate sensor according to the related art is schematically illustrated. Coriolis structure 4, drive structure 2, and detection structure 3 are configured in layer 10 just as are the springs via which they are connected in each case. A buried conductive layer 15 is formed underneath layer 10. Buried layer 15 is used as a strip conductor or as an electrode. Oxide layers 9, in which contact areas 5 may also be provided, are deposited between the substrate and buried conductive layer 15 and between same and thick polysilicon layer 10. Layer 10 (or its structures) is exposed through a trenching process 6 and an oxide sacrificial layer process.

Figure 3:
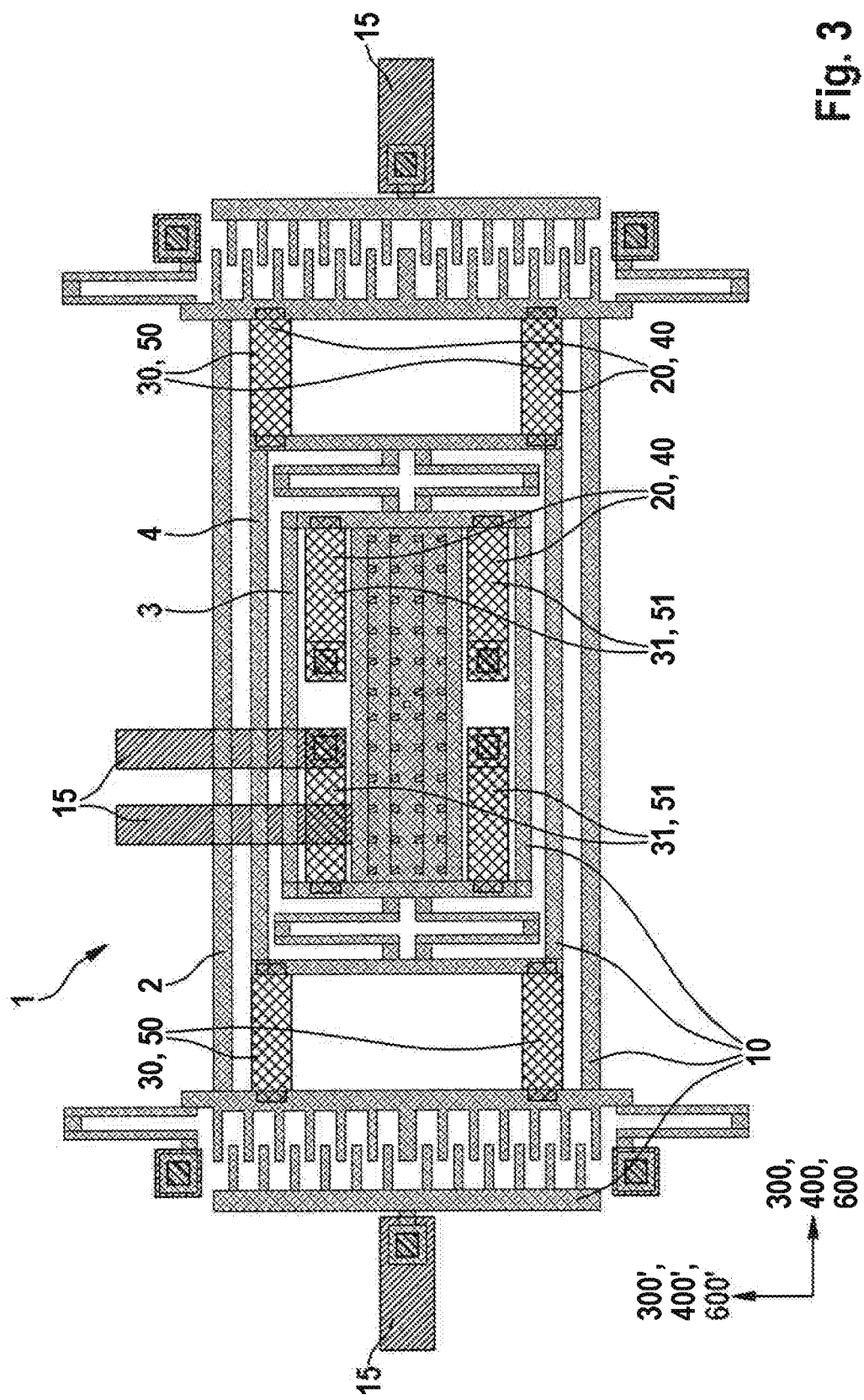
FIG. 3 schematically shows a top view of a rotation rate sensor according to one specific embodiment of the present invention.

In FIG. 3, a top view of a section of a rotation rate sensor 1 according to one specific embodiment of the present invention is schematically shown. Rotation rate sensor 1 includes a drive structure 2 (configured as a drive frame), a Coriolis structure 4 (configured as a Coriolis frame), and a detection structure 3 (configured as a detection frame). Drive structure 2, Coriolis structure 4, and detection structure 3 are configured as a part of a layer 10 and have the same expansion or thickness in a first extension direction 100 perpendicular to a main extension plane 600, 600' of layer 10. Drive structure 2 may be driven with the aid of comb electrodes. Drive structure 2 and Coriolis structure 4 are mechanically resiliently coupled to one another with the aid of a total of four first spring components 30 and/or four further first spring components 50. Detection structure 3 and the underlying substrate (or a conductive buried layer 15 of the substrate) are mechanically resiliently coupled to one another with the aid of four second spring components 31 and/or four further second spring components 51. First and second spring component 30, 31 are configured as a part of an additional layer 20 and/or further first spring component and further second spring component 50, 51 are configured as a part of a further additional layer 40. Additional layer 20 (or spring components 30, 31 configured as a part thereof) and/or further additional layer 40 (of further spring components 50, 51 configured as a part thereof) are thinner in each case (in extension direction 100 or further extension direction 200 perpendicular to a main extension plane 600, 600' of layer 10) than layer 10 or Coriolis structure 4, drive structure 2, and detection structure 3. Spring components 30, 31 and/or further spring components 50, 51 each have in (further) first main extension direction 300, 400 of additional layer 20 and/or further additional layer 40 as well as in (further) second main extension direction 300', 400' of additional layer 20 and/or further additional layer 40 a larger expansion than in (further) extension direction 100, 200 perpendicular to (further) first and second main extension direction 300, 400, 300', 400'. For this reason, spring components 30, 31 and/or further spring components 50, 51 are each less stiff in (further) extension direction 100, 200 perpendicular to (further) first and second main extension directions 300, 400, 300', 400' than in (further) first and second main extension directions 300, 400, 300', 400'.

Figure 4:
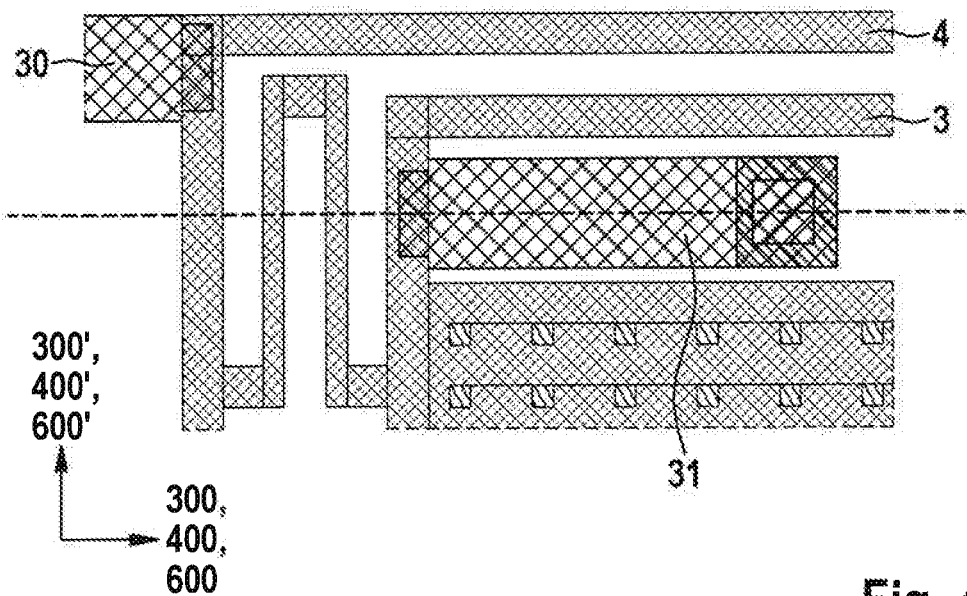
FIG. 4 schematically shows a top view of a section of a rotation rate sensor according to one specific embodiment of the present invention.

In FIG. 4, a top view of a section of a rotation rate sensor 1 according to one specific embodiment of the present invention is schematically shown. In particular, a second spring component 31 is illustrated with the aid of which a mechanically resilient connection between detection structure 3 and the underlying substrate (or a conductive buried layer 15 of the substrate) is established. Second spring component 31 is configured as a part of an additional layer 20 underneath layer 10 (i.e. closer to the substrate). Furthermore, a subarea of a Coriolis structure and a first spring component 30 are illustrated.

Figure 5:
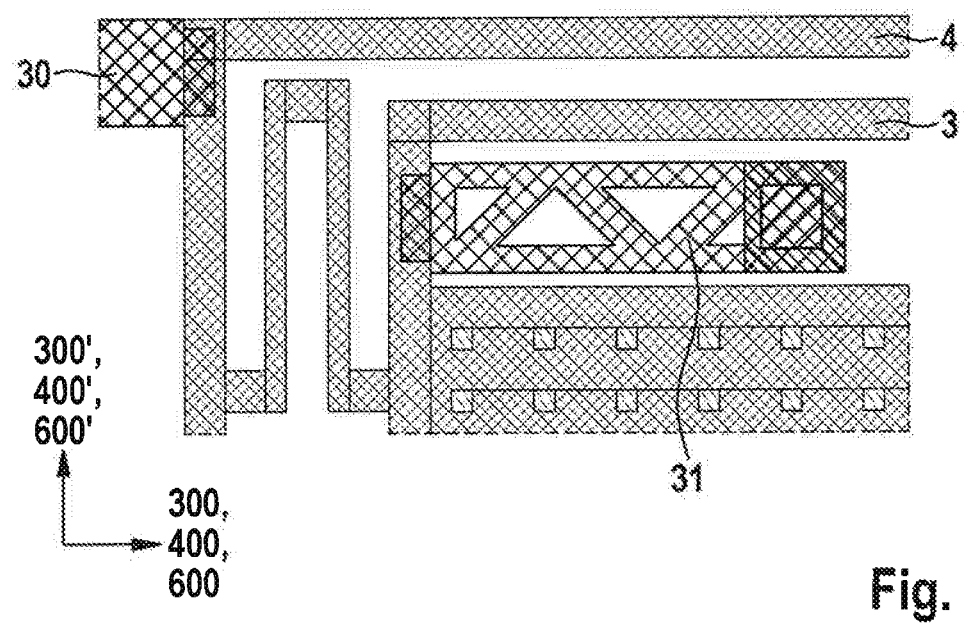
FIG. 5 schematically shows a top view of a section of a rotation rate sensor according to one specific embodiment of the present invention.

In FIG. 5, a top view of a section of a rotation rate sensor 1 according to one specific embodiment of the present invention is schematically shown. In particular, a second spring component 31 is illustrated with the aid of which a mechanically resilient connection between detection structure 3 and the underlying substrate (or a conductive buried layer 15 of the substrate) is established. Second spring component 31 is configured as a part of an additional layer 20 underneath layer 10 (i.e., closer to the substrate). Second spring component 31 includes multiple beams, whereby a desired stiffness is particularly advantageously achievable in first main extension direction 300 of additional layer 20 and in second main extension direction 300' of additional layer 20. Furthermore, a subarea of a Coriolis structure and a first spring component 30 are illustrated.

Figure 6:
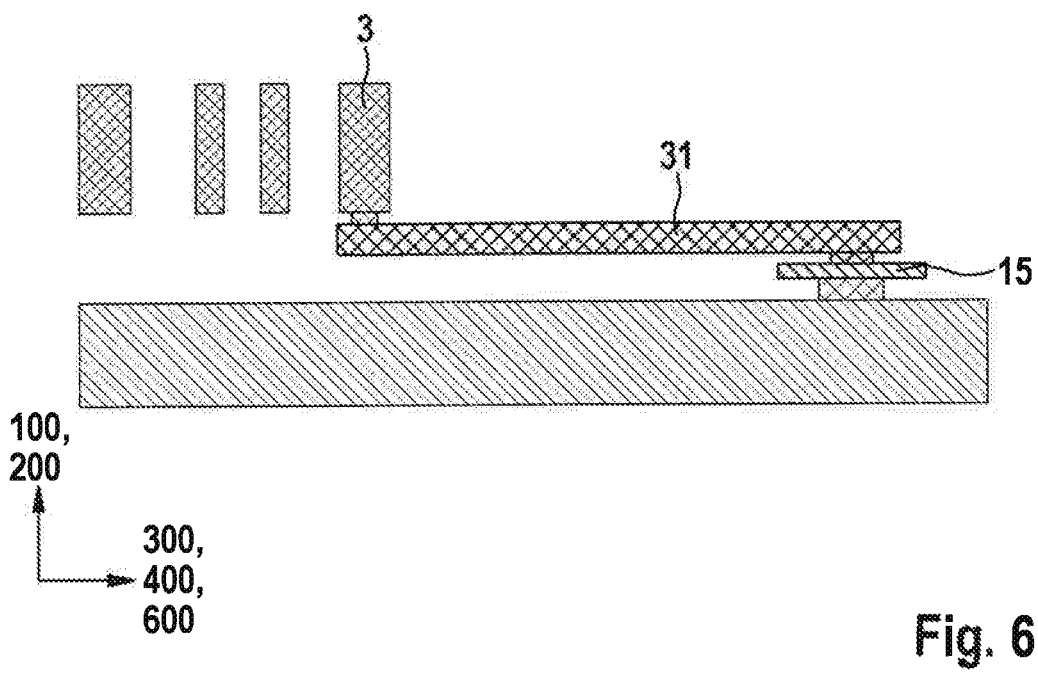
FIG. 6 schematically shows a cross section through a section of a rotation rate sensor according to one specific embodiment of the present invention.

In FIG. 6, a cross section through a section of a rotation rate sensor 1 according to one specific embodiment of the present invention is schematically shown along the dashed line plotted in FIG. 4. Here, a part of detection structure 3 is illustrated which is connected to a conductive buried layer 15 of the substrate with the aid of second spring component 31. Detection structure 3 has a larger expansion in a (further) extension direction 100, 200 perpendicular to (further) first and second main extension directions 300, 400, 300', 400' than second spring component 31.

Figure 7:
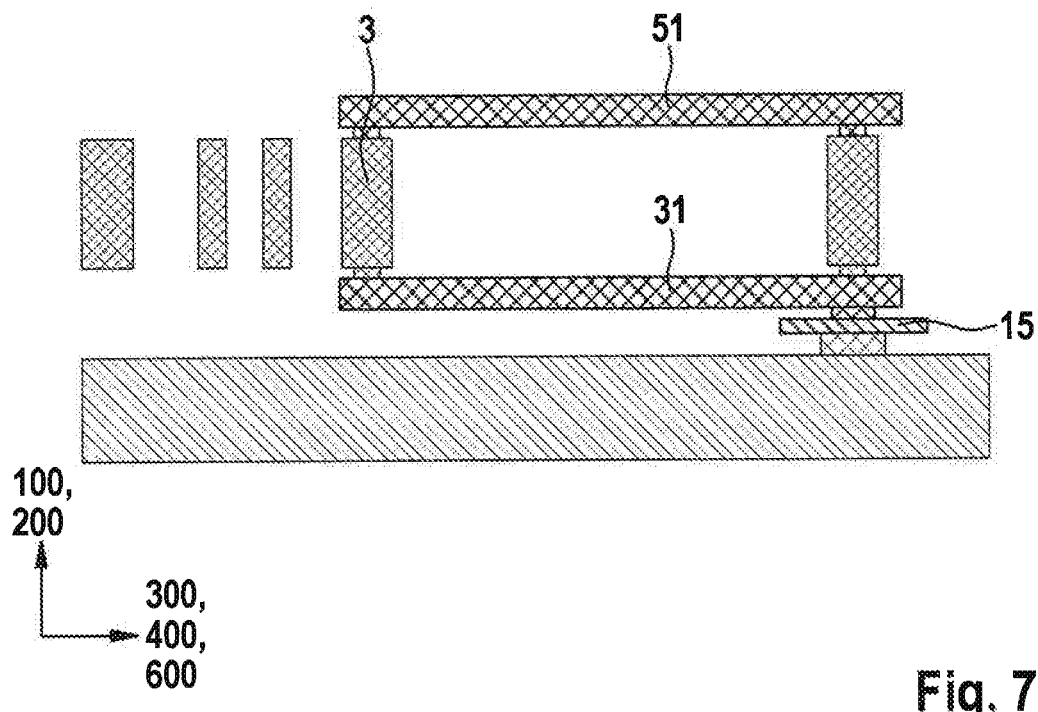
FIG. 7 schematically shows a cross section through a section of a rotation rate sensor according to one specific embodiment of the present invention.

In FIG. 7, a cross section through a section of a rotation rate sensor 1 according to one specific embodiment of the present invention is schematically shown. Here, the specific embodiment shown in FIG. 7 has the features of the specific embodiment described with reference to FIG. 6. Additionally, the specific embodiment illustrated in FIG. 7 shows a further second spring component 51 which is situated above detection structure 3. Detection structure 3 and the substrate are resiliently connected to one another with the aid of further second spring component 51. Detection structure 3 has a larger expansion in a (further) extension direction 100, 200 perpendicular to (further) first and second main extension directions 300, 400, 300', 400' than further second spring component 51.

It may be provided according to the present invention that layer 10, additional layer 20 and further additional layer 40 (and further may be provided, conductive buried layer 15) are polysilicon functional layers. In this case, oxide layers, which have passages with the aid of which the functional layers are connected (i.e. polysilicon material is also situated in the passages), are typically deposited between different functional layers 10, 20, 40, 15. This is indicated in FIGS. 4 and 5.

What is claimed is:

1. A rotation rate sensor, comprising:
   a substrate;
   a drive structure, which is movable with regard to the substrate;
   a detection structure; and
   a Coriolis structure, wherein the drive structure, the Coriolis structure, and the detection structure are essentially situated in a layer, and wherein:
      an additional layer is situated essentially in parallel to the layer underneath the layer and a further additional layer is formed essentially in parallel to the layer above the layer, wherein the further additional layer extends a same distance as the additional layer in both a first main extension direction of the additional layer and a second main extension direction of the additional layer;
      wherein a mechanical connection between the Coriolis structure and the drive structure is established with a first spring component, which is configured as a part of the additional layer, and/or wherein a mechanical connection between the detection structure and the substrate is established with a second spring component, which is configured as a part of the additional layer.

2. The rotation rate sensor of claim 1, wherein at least one of:
   the first spring component has a lesser expansion in an extension direction perpendicular to a main extension plane of the additional layer than in a first main extension direction of the additional layer and in a second main extension direction of the additional layer, or
   the second spring component has a lesser expansion in the extension direction perpendicular to the main extension plane of the additional layer than in the first main extension direction of the additional layer and in the second main extension direction of the additional layer.

3. The rotation rate sensor of claim 1, wherein at least one of the first spring component or the second spring component includes at least one beam.

4. The rotation rate sensor of claim 1, wherein at least one of the first spring component or the second spring component includes a framework structure or a lattice structure.

5. The rotation rate sensor of claim 1, wherein at least one of:
   the first spring component has a lesser expansion in an extension direction perpendicular to a main extension plane of the additional layer than the Coriolis structure, the detection structure, and/or the drive structure, or
   the second spring component has a lesser expansion in an extension direction perpendicular to a main extension plane of the additional layer than the Coriolis structure, the detection structure, and/or the drive structure.

6. The rotation rate sensor of claim 1, wherein at least one of the rotation rate sensor is configured to detect a rotation rate in a first main extension direction of the layer or a second main extension direction of the layer.

7. The rotation rate sensor of claim 1, wherein a detection electrode is situated at least partially above or underneath the detection structure.

8. The rotation rate sensor of claim 1, wherein at least one of the first spring component or the second spring component includes a plurality of beams.

9. The rotation rate sensor of claim 1, wherein at least one of the first spring component or the second spring component includes a plurality of beams, and wherein a further first spring component or a further second spring component includes at least one beam.

10. The rotation rate sensor of claim 1, wherein at least one of the first spring component or the second spring component includes a plurality of beams, and wherein at least one of a further first spring component or a further second spring component includes a plurality of beams.

11. The rotation rate sensor of claim 1, wherein at least one of the first spring component or the second spring component includes a framework structure or a lattice structure, and wherein at least one of a further first spring component or a further second spring component includes a framework structure or a lattice structure.

12. The rotation rate sensor of claim 1, wherein at least one of:
   the first spring component has a lesser expansion in an extension direction perpendicular to a main extension plane of the additional layer than at least one of the Coriolis structure, the detection structure, or the drive structure, or
   the second spring component has a lesser expansion in an extension direction perpendicular to a main extension plane of the additional layer than at least one of the Coriolis structure, the detection structure, or the drive structure,
   wherein a further first spring component has a lesser expansion in a further extension direction perpendicular to a further main extension plane of the further additional layer than at least one of the Coriolis structure, the detection structure, or the drive structure, or
   a further second spring component has a lesser expansion in the further extension direction perpendicular to the further main extension plane of the further additional layer than at least one of the Coriolis structure, the detection structure, or the drive structure.

13. A rotation rate sensor, comprising:
   a substrate;
   a drive structure, which is movable with regard to the substrate;
   a detection structure; and
   a Coriolis structure, wherein the drive structure, the Coriolis structure, and the detection structure are essentially situated in a layer, and wherein an additional layer is situated essentially in parallel to the layer above or underneath the layer;
   wherein a mechanical connection between the Coriolis structure and the drive structure is established with a first spring component, which is configured as a part of the additional layer, and/or wherein a mechanical connection between the detection structure and the substrate is established with a second spring component, which is configured as a part of the additional layer,
   wherein the additional layer is formed underneath the layer, and a further additional layer is formed essentially in parallel to the layer above the layer, and wherein a mechanical connection between the Coriolis structure and the drive structure is established with a further first spring component, which is configured as a part of the further additional layer, and/or wherein a mechanical connection between the detection structure and the substrate is established with a further second spring component, which is configured as a part of the further additional layer.

14. The rotation rate sensor of claim 13, wherein at least one of:
- the further first spring component has a lesser expansion in a further extension direction perpendicular to a further main extension plane of the further additional layer than in a first further main extension direction of the further additional layer and in a second further main extension direction of the further additional layer, or
- the further second spring component has a lesser expansion in the further extension direction perpendicular to the further main extension plane of the further additional layer than in the first further main extension direction of the further additional layer and in the second further main extension direction of the further additional layer.

15. A method for manufacturing a rotation rate sensor, the method comprising:
- providing a substrate;
- providing a drive structure, which is movable with regard to the substrate;
- providing a detection structure; and
- providing a Coriolis structure, wherein the drive structure, the Coriolis structure, and the detection structure are essentially situated in a layer, and wherein an additional layer is situated essentially in parallel to the layer underneath the layer and a further additional layer is formed essentially in parallel to the layer above the layer, wherein the further additional layer extends a same distance as the additional layer in both a first main extension direction of the additional layer and a second main extension direction of the additional layer;
- wherein a mechanical connection between the Coriolis structure and the drive structure is established with a first spring component, which is configured as a part of the additional layer, and/or wherein a mechanical connection between the detection structure and the substrate is established with a second spring component, which is configured as a part of the additional layer.

* * * * *